US011398834B2

(12) United States Patent
Fannes et al.

(10) Patent No.: US 11,398,834 B2
(45) Date of Patent: Jul. 26, 2022

(54) ENCODER, RECORDING DEVICE, DECODER, PLAYBACK DEVICE WITH ROBUST DATA BLOCK HEADER (71) Applicant: AURO TECHNOLOGIES NV, Mol (BE)

(72) Inventors: Geert Fannes, Zoersel (BE); Bert Van Daele, Wilsele (BE)

(73) Assignee: AURO TECHNOLOGIES NV, Mol (BE)

(*) Notice: Subject to any disclaimer, the term of this patent is extended or adjusted under 35 U.S.C. 154(b) by 316 days.

(21) Appl. No.: 16/341,577

(22) PCT Filed: Oct. 16, 2017

(86) PCT No.: PCT/EP2017/076361
§ 371 (c)(1),
(2) Date: Apr. 12, 2019

(87) PCT Pub. No.: WO2018/069550
PCT Pub. Date: Apr. 19, 2018

(65) Prior Publication Data
US 2020/0044664 A1 Feb. 6, 2020

(30) Foreign Application Priority Data
Oct. 14, 2016 (EP) .................................. 16002210

(51) Int. Cl.
*H03M 13/09* (2006.01)
*H03M 13/11* (2006.01)
(Continued)

(52) U.S. Cl.
CPC ..... *H03M 13/096* (2013.01); *H03M 13/1108* (2013.01); *H03M 13/21* (2013.01);
(Continued)

(58) Field of Classification Search
CPC ................. H04L 1/0061; H04L 1/0057; H04L 25/03866; H04L 1/0045; H04L 2209/16;
(Continued)

(56) References Cited

U.S. PATENT DOCUMENTS 5,852,664 A * 12/1998 Iverson ................ H04N 7/1675
340/5.31
6,912,686 B1 * 6/2005 Rodriguez .......... G06F 11/1076
714/763
(Continued)

FOREIGN PATENT DOCUMENTS

EP 0 421 871 A2 4/1991
EP 0421871 A2 * 10/1991 ............. G11B 20/12
(Continued)

OTHER PUBLICATIONS

International Search Report for PCT/EP2017/076361 dated Jan. 31, 2018 [PCT/ISA/210], with attached Written Opinion [PCT/ISA/237].

*Primary Examiner* — Lizbeth Torres-Diaz
(74) *Attorney, Agent, or Firm* — Sughrue Mion, PLLC (57) ABSTRACT

The current invention relates to an encoder for converting a set of data words into a data block having a header section, a checksum section and a payload section; the encoder comprising: a header inserter arranged to insert a header pattern in the data block; a checksum calculator arranged to calculate a checksum of the set of data words; a data word converter arranged to convert the set of data words into a set of obfuscated data words being a result of applying an exclusive or operation between the set of data words and the checksum.

16 Claims, 8 Drawing Sheets

(51) Int. Cl.
*H04L 25/03* (2006.01)
*H03M 13/21* (2006.01)
*H03M 13/29* (2006.01)
*H03M 13/33* (2006.01)

(52) U.S. Cl.
CPC ..... *H03M 13/2942* (2013.01); *H03M 13/333* (2013.01); *H04L 25/03866* (2013.01)

(58) Field of Classification Search
CPC ............. H03M 13/096; H03M 13/333; H03M 13/1108; G06F 21/602
See application file for complete search history.

(56) References Cited

U.S. PATENT DOCUMENTS

| | | | | |
|---|---|---|---|---|
| 7,292,606 | B2* | 11/2007 | Li | H04L 27/2675 |
| | | | | 370/518 |
| 2004/0057499 | A1* | 3/2004 | Haartsen | H04B 1/713 |
| | | | | 375/136 |
| 2005/0149823 | A1* | 7/2005 | Lee | H03M 13/096 |
| | | | | 714/758 |
| 2006/0236200 | A1* | 10/2006 | Tanaka | H04N 19/63 |
| | | | | 375/E7.073 |
| 2009/0157748 | A1* | 6/2009 | Hess | G16H 20/10 |
| 2014/0092963 | A1* | 4/2014 | Wang | H04N 19/50 |
| | | | | 375/240.12 |
| 2016/0036885 | A1* | 2/2016 | Takashima | H04L 67/2823 |
| | | | | 709/246 |
| 2016/0173918 | A1* | 6/2016 | Lee | H04N 21/435 |
| | | | | 725/116 |
| 2017/0257186 | A1* | 9/2017 | Ge | H04L 1/0061 |
| 2017/0289321 | A1* | 10/2017 | Hartwich | H04L 12/407 |
| 2019/0207719 | A1* | 7/2019 | Shevchenko | H04L 1/0061 |
| 2020/0044664 | A1* | 2/2020 | Fannes | H03M 13/2942 |
| 2020/0213096 | A1* | 7/2020 | Fernandez | H04L 9/14 |
| 2020/0287744 | A1* | 9/2020 | Kang | H04L 12/40032 |
| 2022/0044500 | A1* | 2/2022 | Yang | H04L 12/40 |

FOREIGN PATENT DOCUMENTS

| | | |
|---|---|---|
| JP | 56-156045 A | 12/1981 |
| JP | 5-219051 A | 8/1993 |

* cited by examiner

ENCODER, RECORDING DEVICE, DECODER, PLAYBACK DEVICE WITH ROBUST DATA BLOCK HEADER

CROSS REFERENCE TO RELATED APPLICATIONS

This application is a National Stage of International Application No. PCT/EP2017/076361, filed on Oct. 16, 2017, which claims priority from European Patent Application No. 16002210.9, filed on Oct. 14, 2016, the entire disclosures of which are incorporated herein by reference.

TECHNICAL FIELD

The invention pertains to the technical field of encoding of data words into a data block having a data header.

BACKGROUND

There remains a need in the art for a robust encoder and decoder for encoding and decoding sets of data words which may e.g. relate to audio or video signals.

EP 1 529 365 discloses a method and apparatus for encrypting and authenticating data such that some of data can be transmitted in the clear but still be authenticated by the sender. A set of cleartext positions and/or a set of ciphertext positions are used to specify which data blocks will be used to generate an input checksum value and an output checksum value. These checksums are then used to generate an authentication tag. Since EP 1 529 365 is directed mainly at information security, the proposed use of checksums leads to an excessively complex decoder and decoding method.

The present invention aims to resolve at least some of the problems identified.

SUMMARY OF THE INVENTION

This invention relates to an encoder for converting a set of data words into a data block, the encoder comprising:
- a header inserter arranged to insert a header pattern in the data block;
- a checksum calculator arranged to calculate a checksum of the set of data words; and
- a data word converter arranged to convert the set of data words into a set of obfuscated data words being a result of applying an exclusive or operation between the set of data words and the checksum.

Such an encoder forms the basic data block by inserting data words into a payload section of the data block and completing the data block with a checksum and a header.

The segmentation of a binary data stream into data blocks by using header patterns and the addition of error detection capabilities by adding a checksum to a binary data stream allows the binary data stream to be transmitted in packets and allows the receiver/playback device to detect and reconstruct one or more binary large objects (blob) within a stream of bytes. It uses a start of header marker (SOH) to indicate the start of a data block.

Such an encoder however has the disadvantage that in random data in the set of data words occasionally a header pattern such as a start of header may occur that would lead to a false synchronization by a receiver/playback device.

It is an objective of the present invention to reduce the occurrence of header patterns in the payload section of the data block.

To achieve this objective, in a first aspect, the present invention provides an encoder according to claim 1. Such an encoder is characterized in that the encoder comprises a header pattern eliminator arranged for, as long as a header pattern is detected in the result of the exclusive or operation, in a number of iterations n, n being between 1 to the number of bits of the checksum control,
- a checksum modifier to create an $n^{th}$ checksum by modifying an $n^{th}$ bit of the checksum,
- the data word converter to convert the set of data words into an $n^{th}$ set of obfuscated data words being the result of applying an exclusive or operation between the set of data words and the $n^{th}$ checksum,
- a header pattern detector to detect a header pattern in the $n^{th}$ set of obfuscated data words and if no header pattern is detected control a payload inserter to insert the $n^{th}$ checksum in the checksum section and the $n^{th}$ set of obfuscated data words in the payload section of the data block.

For most existing encoders that support segmentation and error detection, the two mechanisms work independently. In the present invention the checksum is not only used to check and correct the data words but also used to obfuscate the data words, thus also obfuscating the false header pattern in the set of data words in the payload section by performing an exclusive or operation between the set of data words and the checksum and inserting the set of data words with the set of obfuscated data words resulting from the exclusive or operation in the payload section of the data block on the condition the header pattern detector fails to detect a header pattern in the result of the exclusive or operation. In case a header pattern is still present at least a further round of modifying a further bit of the checksum and using this to create a further obfuscated set of data words from the original set of data words is performed.

As a result, an obfuscated set of data words without any occurrence of the header pattern is available for storing/transmitting, together with the modified checksum that was used in the exclusive or operation with the set of data words. These two elements allow the decoder to, using a simple exclusive or operation between the obfuscated set of data words and the corresponding modified checksum, recreate the original set of data words.

As many rounds as there are bits in the checksum to be modified are possible. Only as many rounds as are necessary to obtain a header-pattern-free obfuscated set of data words are performed, i.e. the operation is stopped with the first value of n, say $N_0$, where the result of the exclusive or operation does not contain a header pattern. This header-pattern-free obfuscated set of data words is then inserted in the payload section of the data block, and the associated checksum is inserted in the checksum section of the data block. In this way it is prevented that an erroneous header pattern in the payload section of the data can occur.

In a second aspect, the present invention provides a decoder for converting a data block into a set of data words, the decoder comprising
- a header detector for locating a header in the data block;
- a checksum extractor to extract a checksum from the data block;
- a code word converter arranged to extract the set of data words by applying an exclusive or operation between the code words of the data block and the extracted checksum;
- a checksum calculator arranged to calculate a checksum of the extracted set of data words; and a checksum verifier arranged to compare the calculated
checksum to the extracted checksum and provide an
error indication based on a result of the comparing.

Such a decoder advantageously combines error detection with segmentation, with a combined use of the checksum for both aims. Moreover, since the occurrence of header patterns in the payload section of the data block is reduced at the side of the encoder, the decoder has the advantage of being simple to implement, plainly looking at the start of header marker (SOH) to detect the start of a data block.

In a further aspect, the present invention provides a recording device beneficially comprising an encoder as disclosed.

In a further aspect, the invention provides a playback device beneficially comprising a decoder as disclosed.

In a further aspect, the present invention provides an encoding method for converting a set of data words into a data block, the method comprising the steps of
inserting a header pattern in the data block;
calculating a checksum of the set of data words;
converting the set of data words into a set of obfuscated data words being a result of applying an exclusive or operation between the set of data words and the checksum;
whereby the method further comprises the steps of, for each n from 1 to the number of bits of the checksum and for as long as a header pattern is detected in the result of the exclusive or operation
creating an $n^{th}$ checksum by modifying an $n^{th}$ bit of the checksum;
converting the set of data words into an $n^{th}$ set of obfuscated data words being the result of applying an exclusive or operation between the set of data words and the $n^{th}$ checksum; and
detecting a header pattern in the $n^{th}$ set of obfuscated data words and if no header pattern is detected, inserting the $n^{th}$ checksum in the checksum section and the $n^{th}$ set of obfuscated data words in the payload section of the data block.

In a further aspect, the invention provides a decoding method for converting a data block into a set of data words, the method comprising the steps of:
locating a header in the data block;
extracting a checksum from the data block;
extracting the set of data words by applying an exclusive or operation between the code words of the data block and the extracted checksum;
calculating a checksum of the extracted set of data words; and
comparing the calculated checksum to the extracted checksum and provide an error indication based on a result of the comparing.

Further preferred embodiments and their advantages are provided in the dependent claims and the detailed description.

DETAILED DESCRIPTION OF THE
INVENTION

In a first aspect, the present invention provides an encoder according to claim 1.

In an embodiment of the encoder the $n+1^{th}$ bit is adjacent to the $n^{th}$ bit of the checksum. By modifying an adjacent bit in every iteration it is possible to keep track of how many iterations have been performed as in each consecutive iteration an adjacent bit in the modified checksum has been modified. If non-consecutive bits have been changed this is an indication of an error in the transmission of the checksum or the payload. This is so because, in cases where no transmission errors occurred, only modified checksums with adjacent bit values flipped from 0 to 1 or 1 to 0 (i.e. modified) without interspersed non-modified bits are possible.

In an embodiment of the encoder, when n=1, the least significant bit of the checksum is the bit to be modified. This implies that when other bits of the modified checksum have changed from 0 to 1 or from 1 to 0 but not the least significant bit, an error occurred during transmission of the checksum or the payload. The least significant bit of the checksum being the first bit whose value can be flipped compared to the original checksum of the set of data words, other bits are only allowed to be flipped when the least significant bit is also flipped. This allows a check on the modified checksum. In an alternative embodiment of the encoder, another of the bits of the checksum is to be modified. For instance, when n=1, the first bit to be modified may be the most significant bit, and adjacent bits may be modified as n increases.

In a second aspect, the present invention provides a decoder as disclosed. The decoder may function as follows. The header detector locates the header in the data stream and thus enables the decoder to locate the start of the data block. This allows the extraction of the checksum and the obfuscated set of data words from the payload section of the data block. However the checksum may be a modified checksum or the original checksum. The extraction is performed by applying an exclusive or operation to the checksum extracted from the checksum section of the data block and the obfuscated set of data words extracted from the payload section of the data block. This results in the original set of data words. In order to perform an error check on the received data the checksum is calculated by the checksum calculator over the result of the exclusive or operation. This checksum is subsequently compared to the extracted checksum. If this calculated checksum matches the extracted checksum no further action is needed as the set of data words extracted was correctly received and no errors occurred to the checksum during the transmission. In case the extracted checksum and calculated checksum differ, it is checked that the difference is limited to modified bits that were expected to be modified according to the scheme used during encoding. If this is the case the set of data words is accepted as correctly received.

In an embodiment of the decoder the checksum verifier is arranged to locate a modified bit in the extracted checksum by comparing it to the calculated checksum. If this calculated checksum matches the extracted checksum no further action is needed as the set of data words extracted was correctly received and no errors occurred to the checksum during the transmission. In case the extracted checksum and calculated checksum differ, it is checked that the difference is limited to modified bits that were expected to be modified according to the scheme used during encoding. If this is the case the set of data words is accepted as correctly received.

In a further embodiment of the decoder the modified bits in the extracted checksum are required to be adjacent. In an embodiment where the encoder uses a schema of only modifying adjacent bits during successive iterations, the received modified checksum may only differ in adjacent bits, otherwise an error during the transmission occurred.

In a further embodiment of the decoder a least significant bit of the extracted check sum is required to be modified if any bit of the extracted checksum is modified. When the encoder first modifies, if required, the least significant bit, the extracted checksum must have the least significant modified compared to the checksum calculated over the set of data words if any bit differs between the calculated checksum and the extracted checksum. In an alternative embodiment, another bit of the checksum is modified first. For instance, for n=1 the first bit flipped may be the most significant bit, and adjacent bits may be flipped as n increases.

In a further aspect, the present invention provides an encoding method as disclosed. The encoding method for converting a set of data words into a data block creates a data block having a header section, a checksum section and a payload section. To achieve this a header pattern is inserted in the header section of the data block. In addition a checksum and payload is required and the checksum is calculated over the set of data words that will form the payload in obfuscated form. This calculated checksum is then used to obfuscate the set of data words. This is done by converting the set of data words into a set of obfuscated data words being a result of applying an exclusive or operation between the set of data words and the checksum. If this leads to an obfuscated set of data words where no header pattern is present the obfuscated set of data words together with the checksum of the set of data words is inserted in the data block in their respective sections. If however a header pattern is found an iterative process is started where for each n from 1 to the number of bits of the checksum and for as long as a header pattern is detected in the result of the exclusive or operation an $n^{th}$ checksum is created by modifying an $n^{th}$ bit of the checksum, and the set of data words is converted into an $n^{th}$ set of obfuscated data words being the result of applying an exclusive or operation between the original set of data words and the $n^{th}$ checksum. Each successive checksum has more bits modified i.e. in the third iteration both the first second and third bit of the checksum is modified.

A detection of a header pattern in the $n^{th}$ set of obfuscated data words is then performed and if no header pattern is detected, the $n^{th}$ checksum is inserted in the checksum section and the $n^{th}$ set of obfuscated data words is inserted in the payload section of the data block.

If a header pattern is still found another round in the iteration is to be performed until no header pattern can be detected anymore. In this way it is prevented that a false header pattern in the payload section of the data can occur.

In an embodiment of the encoding method the $n+1^{th}$ bit is adjacent to the nth bit of the checksum. By modifying an adjacent bit in every iteration it is possible to keep track of how many iterations have been performed and as in each consecutive iteration an adjacent bit in the modified checksum have been modified. If non-consecutive bits have been changed this is an indication of an error in the transmission of the checksum or the payload. This is so because, in case no transmission errors occurred, only modified checksums are possible that have adjacent bit values flipped from 0 to 1 or 1 to 0 (i.e. modified) without interspersed non-modified bits.

In a further embodiment of the encoding method when n=1, the least significant bit of the checksum is the bit to be modified. This implies that when other bits of the modified checksum have changed from 0 to 1 or from 1 to 0 but not the least significant bit, an error occurred during transmission of the checksum or the payload. The least significant bit of the checksum being the first bit whose value can be flipped compared to the original checksum of the set of data words, other bits are only allowed to be flipped when least significant bit is also flipped. This allows a check on the modified checksum. In an alternative embodiment of the encoding method, it may be another bit that is modified first. For instance, the most significant bit may be modified first when n=1, and adjacent bits may be modified as n increases.

In a further aspect, the invention provides a decoding method as disclosed. The decoding method may function as follows. The header is located in the data stream and this enables the locating of the start of the data block. This allows the extraction of the checksum and the obfuscated set of data words from the payload section of the data block. However the checksum maybe a modified checksum or the original checksum. The extraction is performed by applying an exclusive or operation to the checksum extracted from the checksum section of the data block and the obfuscated set of data words extracted from the payload section of the data block. This result in the original set of data words.

In order to perform an error check on the received data the checksum is calculated by the checksum calculator over the result of the exclusive or operation. This checksum is subsequently compared to the extracted checksum. If this calculated checksum matches the extracted checksum no further action is needed as the set of data words extracted were correctly received and no errors occurred to the checksum during the transmission. In case the extracted checksum and calculated checksum differ, it is checked that the difference is limited to modified bits that were expected to be modified according to the scheme used during encoding. If this is the case the set of data words is accepted as correctly received.

In an embodiment of the decoding method the method comprises the step of locating a modified bit in the extracted checksum by comparing to the calculated checksum. Comparing the calculated checksum to the extracted checksum allows the decoder to identify the modified bits of the extracted checksum and compare their locations to the calculated checksum as calculated over the extracted set of data words after de-obfuscation with the exclusive or operation. If the pattern of locations does not match the pattern used by the encoder an error is indicated. If the pattern matches there is most likely no error in the received/retrieved data block.

In an embodiment of the decoding method the modified bits in the extracted checksum are required to be adjacent. As a typical pattern used during encoding would result in adjacent bits being modified, checking for this pattern on the receiving side allows the detection of errors during transmission or storage.

In a further embodiment of the decoding method a least significant bit of the extracted check sum is required to be modified if any bit of the extracted checksum is modified. Starting with the least significant bit of the checksum when modifying bits means that also on the receiving side, if any bits differ between the extracted checksum and the calculated checksum the least significant bit has to differ, i.e. be modified otherwise the other difference was not caused by the modification during encoding but by errors during transmission/retrieval. In an alternative embodiment of the decoding method, another bit may be modified first. For instance, it may be the most significant bit that is modified first when n=1, while adjacent bits may be modified for increasing n.

In the present invention, the checksum serves both the purpose of segmentation and the purpose of error detection. As error detection means, in principle, any checksum algorithm may be applied. In a preferred embodiment of the present invention, the checksum is calculated by means of a Fletcher checksum algorithm such as Fletcher-16, Fletcher-32 or Fletcher-64, with a checksum length of 16, 32 or 64 bit, respectively. In view of the desire to keep the decoder as simple as possible, this type of checksum algorithm is found an advantageous choice. In an alternative embodiment, a cyclic redundancy check algorithm (CRC) of e.g. 32 bit or 64 bit may be applied.

In a preferred embodiment of the encoder, the encoder comprises a header pattern eliminator arranged for, for as long as a header pattern is detected in a data-array-to-be-checked, in a number of iterations n, n being between 1 to the number of bits of the checksum control,
- a checksum modifier (8) to create an $n^{th}$ checksum by modifying an $n^{th}$ bit of the checksum,
- the data word converter (4) to convert the set of data words into an $n^{th}$ set of obfuscated data words being the result of applying an exclusive or operation between the set of data words and the $n^{th}$ checksum, and
- a header pattern detector (5) to detect a header pattern in the data-array-to-be-checked, and if no header pattern is detected control a payload inserter (6) to insert the $n^{th}$ checksum in the checksum section and the $n^{th}$ set of obfuscated data words in the payload section of the data block.

Hereby, the data-array-to-be-checked comprises at least the $n^{th}$ checksum, i.e. the checksum section, and the payload section. Hereby, the payload section comprises at least the set of obfuscated data words, and optionally the length of the set of data words. In a preferred embodiment, the data array comprises a concatenation of the header section, the checksum section and the payload section. The advantage hereof is that the chance of finding a header sequence in the encoded data block at any other position than the first may be further mitigated. In another embodiment, the data-array-to-be-checked comprises a concatenation of the header section, the checksum section, the payload section and another header section. This is advantageous in that it allows an even stricter check. Indeed, the chance of finding a header sequence in a burst of "appended" encoded data blocks at any other position than at the start of the respective encoded data blocks may in this way be mitigated. Related, in various embodiments of the encoding method, the data-array-to-be-checked is chosen as indicated. Similarly, in various embodiments of the recording device, the data-array-to-be-checked is chosen as indicated.

The present invention will be now described in more details, referring to examples that are not limitative.

EXAMPLES

Example 1: Encoder

Figure 1:
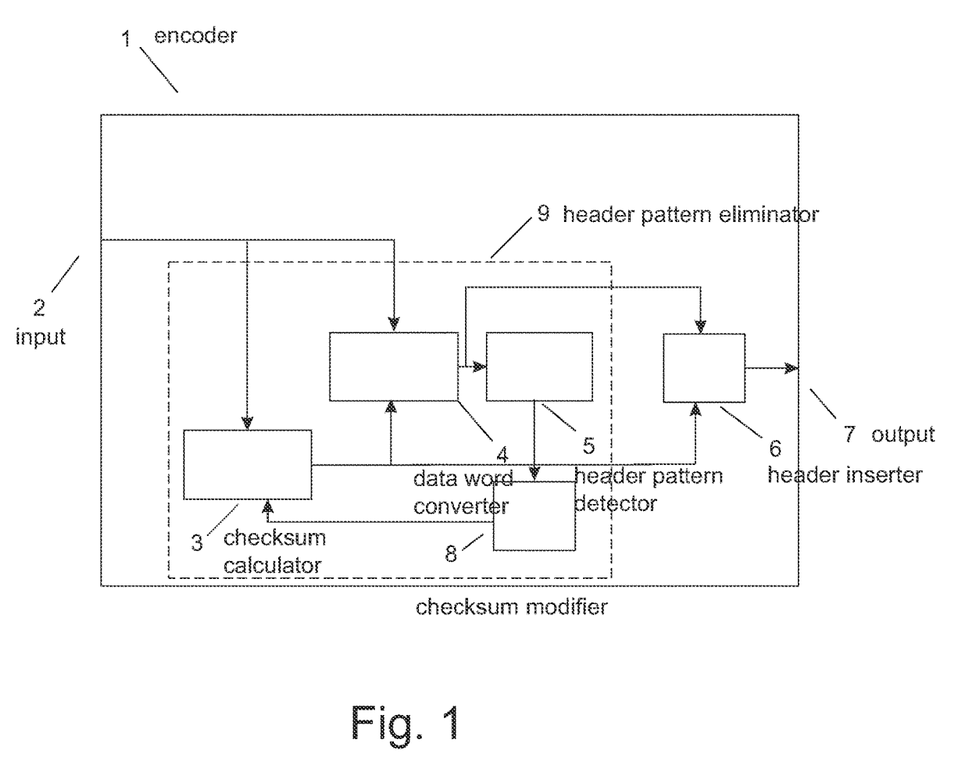
FIG. 1 illustrates an embodiment of the encoder.

FIG. 1 illustrates an embodiment of the encoder. The encoder 1 receives a set of data words via input 2 and comprises an output 7 where a data block having a header section, a checksum section and a payload section is sent out.

The encoder 1 comprises a header inserter 6 arranged to insert a header pattern in the data block before it is sent to the output 7. The encoder 1 further comprises a header pattern eliminator 9 for eliminating header patterns from payload sections.

The header pattern eliminator 9 comprises a checksum calculator 3, a data word converter 4, a header pattern detector 5 and a checksum modifier 8.

The checksum calculator 3 calculates a checksum of the set of data words and provides this checksum to the data word converter 4. The data word converter also receives the set of data words from the input 2.

The data word converter 4 subsequently converts the set of data words into a set of obfuscated data words by applying an exclusive or operation between the set of data words received from the input 2 and the checksum received from the checksum calculator 3.

The data word converter 4 provides the result of the exclusive or operation to the header pattern detector 5 which looks for occurrences of the header pattern in the result of the exclusive or operation. If one or more header patterns are found the header pattern detector 5 signals this to the checksum modifier 8, which in turn modifies the checksum in the checksum calculator 3. In an iteration the set of data words is again converted by the data word converter 4 but now using the modified checksum received from the checksum calculator 3. The result of this conversion, another iteration of the set of obfuscated data words is provided by the data word converter 4 to the header pattern detector 5 which again checks for the presence or absence of the header pattern in this iteration of the set of obfuscated data words.

If after an iteration no header pattern is found by the header pattern detector 5 the iterations stop and both the current modified checksum and the current set of obfuscated data words are provided respectively by the checksum calculator 3 and the data word converter 4 to the header inserter 6 for insertion into their respective section in the data block.

It is to be noted that it is beneficial to include the length of the set of data words as a parameter in the payload section of the data block and include it in the obfuscation by the exclusive or operation. This is important to avoid a header pattern in the encoded length as well. In a preferred embodiment, the length of the set of data words, or, equivalently, the run length, comprises a sequence of bytes and is encoded by means of a type of run-length-encoding, such as the type discussed in Example 8.

It is further to be noted that since the checksum is shorter that the set of data words, a concatenation of several copies of the checksum is used in the exclusive or operation to obtain an input for the data word converter 4 that has a length equal to the set of data words.

Example 2: Decoder

Figure 2:
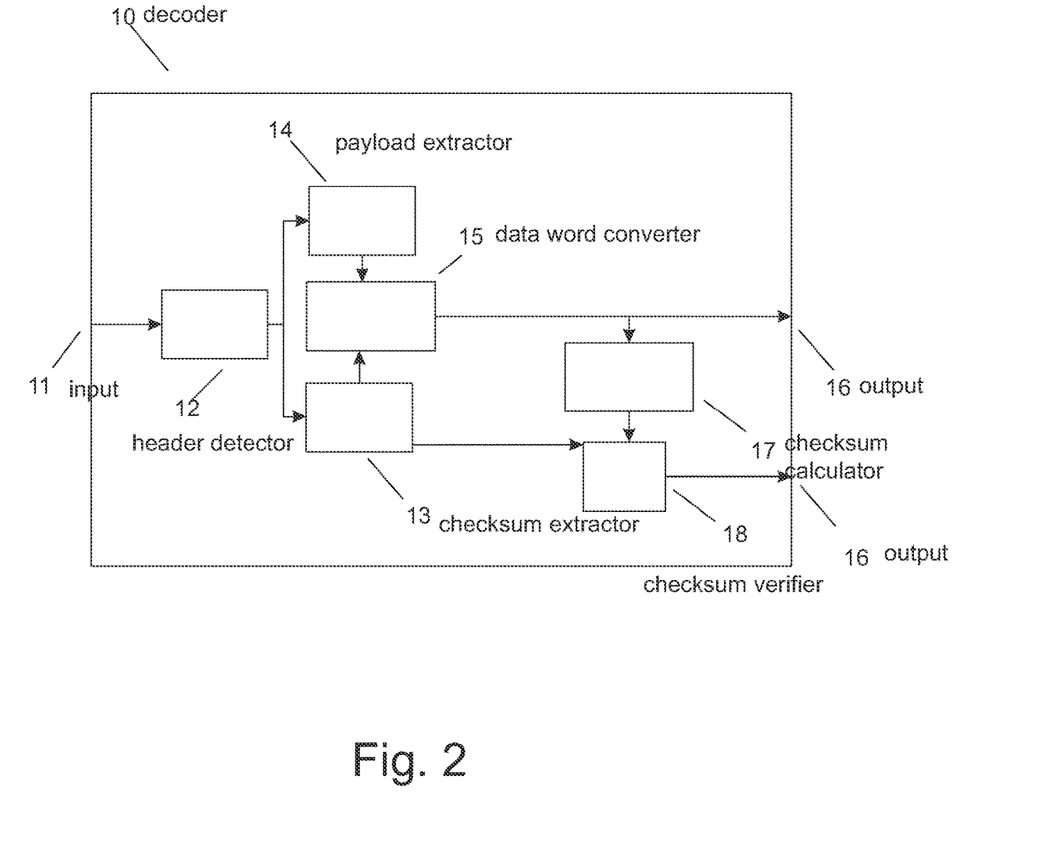
FIG. 2 illustrates an embodiment of the decoder.

FIG. 2 illustrates an embodiment of the decoder. The decoder 10 for converting a data block into a set of data words comprises a header detector 12 for locating a header in the data block and a checksum extractor 13 to extract a checksum from the data block, and a payload extractor 14 to extract the set of obfuscated data words from the data block.

Both the extracted set of obfuscated data words and the extracted checksum are provided to the data word converter 15 which performs an exclusive or operation to the extracted checksum and extracted set of obfuscated data words. The result is the set of data words as originally presented to the encoder. The set of data words is subsequently provided by the code word converter 15 to the output 16 of the decoder 10. In parallel the set of data words is provided by the data word converter 15 to the checksum calculator 17 as well. The checksum calculator thus calculates the checksum of the set of data words, not the set of obfuscated data words, and provides this calculated checksum to the checksum verifier 18. The checksum verifier 18 compares the calculated checksum to the extracted checksum received from the checksum extractor 13 and locates all bit positions that differ. A check is then performed to verify that the pattern of modification (i.e. positions of modified bits) comply with the pattern expected knowing the pattern of subsequent modification of the checksum bits by the encoder.

If the pattern matches (or there are no modified bits) the set of data words has been received without errors and an indication of this is provided to the error indication output 19 of the decoder 10.

If a difference is found that violates the pattern expected from the encoding an error in either the extracted checksum or extracted set of obfuscated data words is likely and an indication to this effect is provided by the checksum verifier 18 to the error indication output 19 of the decoder 10.

It is to be noted that it is beneficial to extract, if included in the data block, the length of the set of data words as a parameter in the payload section of the data block. In a preferred embodiment, the length of the set of data words, or, equivalently, the run length, comprises a sequence of bytes and is encoded by means of a type of run-length-encoding, such as the type discussed in Example 8.

It is further to be noted that since the extracted checksum is shorter that the set of obfuscated data words, a concatenation of several copies of the extracted checksum is used in the exclusive or operation to obtain an input for the data word converter 15 that has a length equal to the set of obfuscated data words.

Example 3: Recording Device

Figure 3:
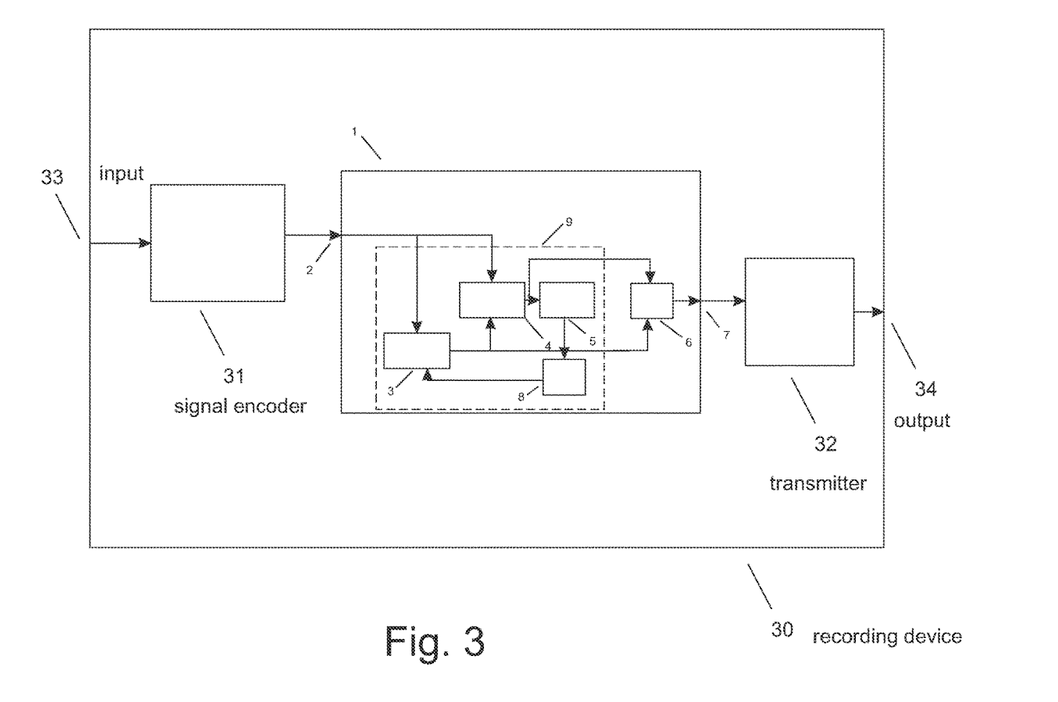
FIG. 3 illustrates an embodiment of the recording device.

FIG. 3 illustrates an embodiment of the recording device. The recording device 30 comprises an input 33 for receiving for instance an audio or a video signal.

The signal is provided by this input 33 to the signal encoder 31 where the signal is encoded for instance according to an audio or video compression standard. This encoded signal is then provided to the encoder 1 which operates as disclosed as in FIG. 1 and assembles the data block as described with the encoder of FIG. 1. The resulting data block is provided to a transmitter 32 which in turn transmits the resulting transmission signal to either a transmission channel (not shown) or a storage device (not shown) via the output 34 of the recording device 30.

Example 4: Playback Device

Figure 4:
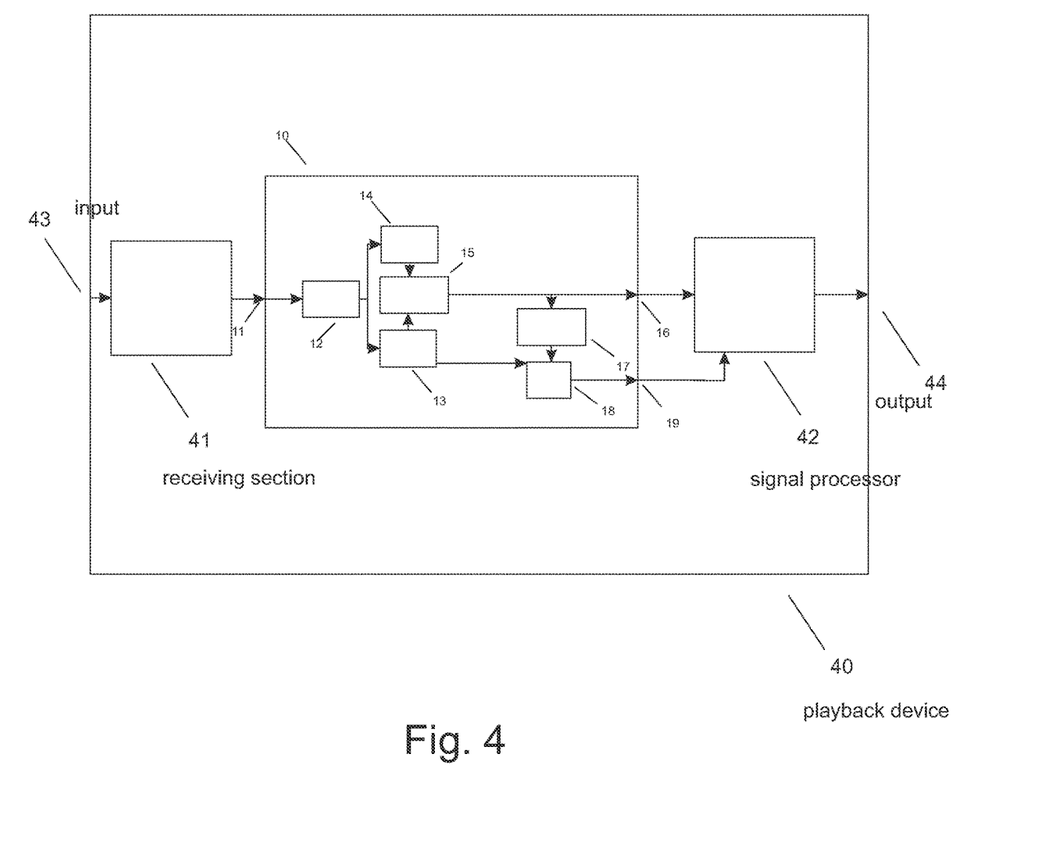
FIG. 4 illustrates an embodiment of the playback device.

FIG. 4 illustrates an embodiment of the playback device. The playback device 40 comprises a decoder, for instance the embodiment of the decoder 10 as described in FIG. 2.

The playback device 40 comprises a receiving section 41 to receive the signal comprising the data blocks from the input 43. The receiving section 41 provides this signal, after conversion to signals suitable for the decoder 10, to the decoder 10. The decoder 10 then operates as described in FIG. 2 and provides the set of data words to the signal processor 42 such as an audio decoder or video decoder where the payload section of the data blocks is used to create for instance an audio signal or a video signal which the playback device subsequently provides to its output 44 to other devices such as amplifiers or displays.

Example 5: Data Block

Figure 5:
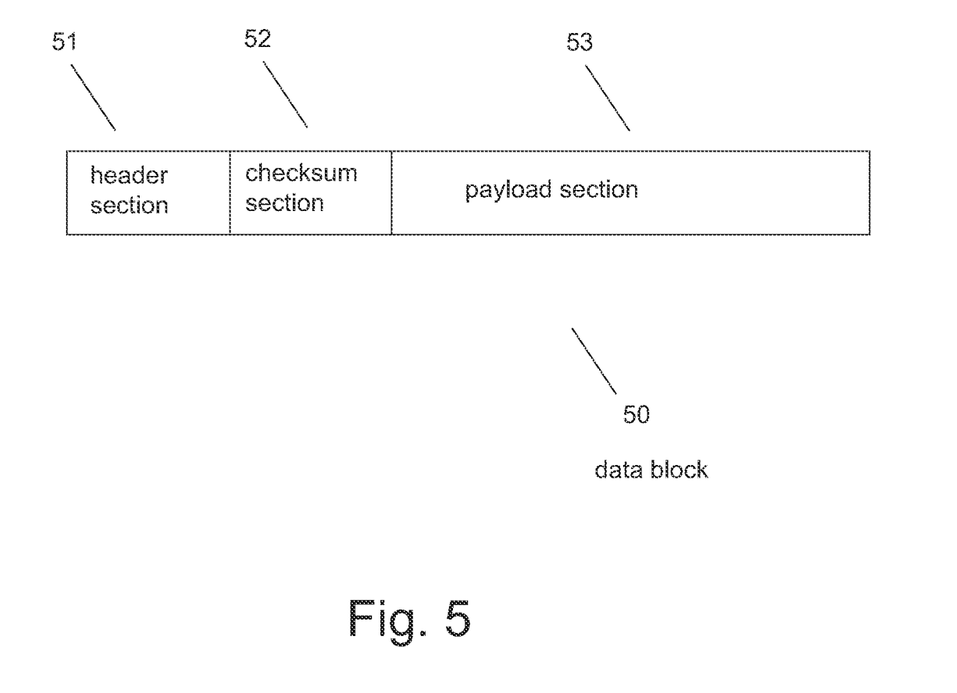
FIG. 5 illustrates an example data block.

FIG. 5 illustrates a data block example. The data block 50 comprises a header section 51, a checksum section 52 and a payload section 53.

The payload section 53 holds the set of obfuscated data words and if applicable a size indication indicating the size of the set of obfuscated data words. The payload section holds data in obfuscated form.

Example 6: Encoding Process

Figure 6:
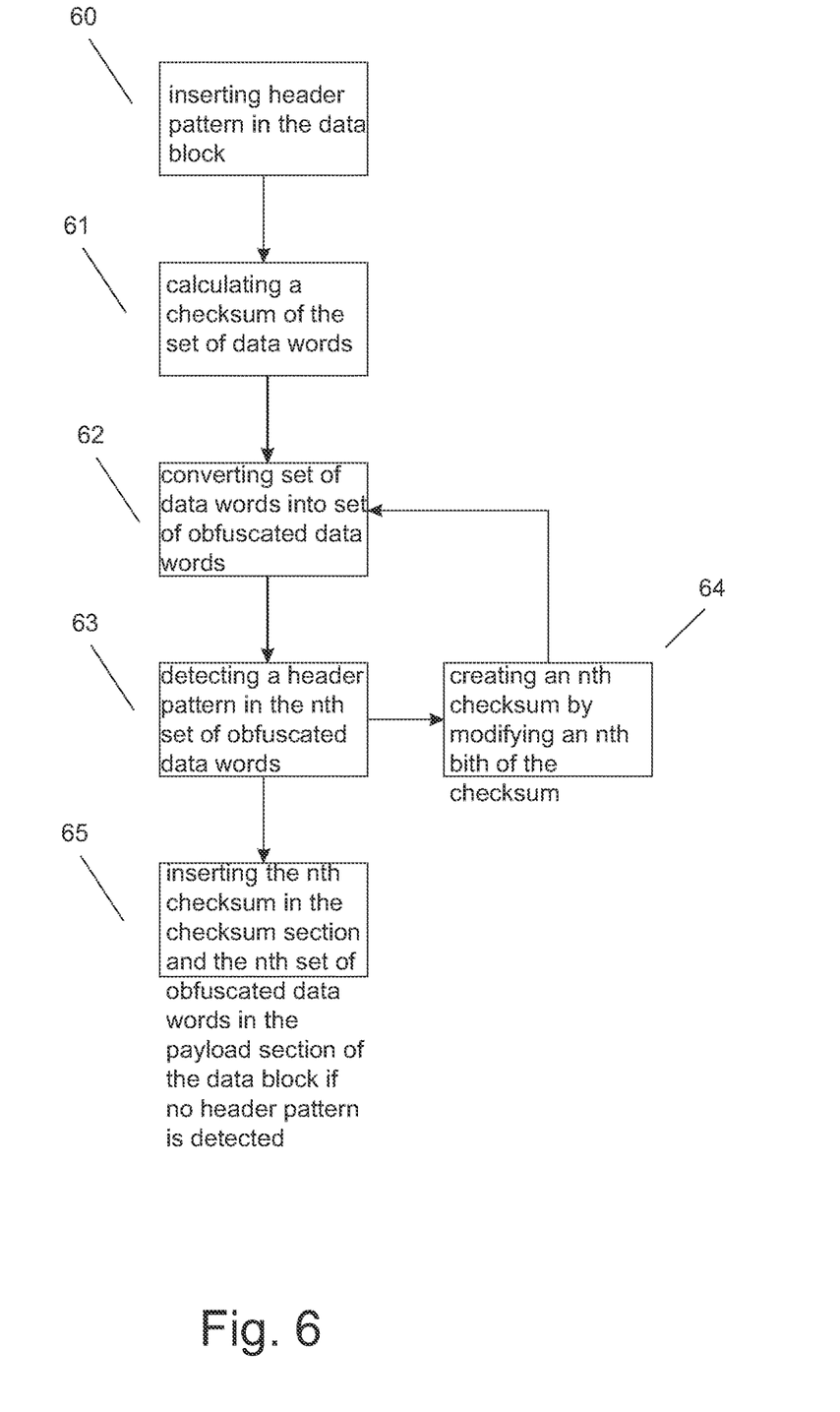
FIG. 6 illustrates an embodiment of the encoding process.

FIG. 6 illustrates an embodiment of the encoding process. The encoding method for converting a set of data words into a data block comprises the steps of inserting 60 a header pattern in the data block, calculating 61 a checksum of the set of data words converting 62 the set of data words into a set of obfuscated data words being a result of applying an exclusive or operation between the set of data words and the checksum and for each n from 1 to maximally the number of bits of the checksum and only for as long as a header pattern is detected in the result of the exclusive or operation creating 64 an $n^{th}$ checksum by modifying an nth bit of the checksum, and converting 62 the set of data words into an nth set of obfuscated data words being the result of applying an exclusive or operation between the set of data words and the $n^{th}$ checksum, detecting 63 a header pattern in the $n^{th}$ set of obfuscated data words and if no header pattern is detected, inserting 64 the nth checksum in the checksum section and the $n^{th}$ set of obfuscated data words in the payload section of the data block. where the $n+1^{th}$ bit is adjacent to the $n^{th}$ bit of the checksum.

As long as the header pattern detecting 63 finds a header pattern in the data destined for the payload section of the data block, i.e. the set of obfuscated data words and if applicable the size of the set of obfuscated data words indication, the checksum is further modified by modifying an additional bit of the checksum, keeping all previously modified bits of the checksum modified. This reduces the chance that after another iteration a header pattern can still be found.

Once there is no header pattern anymore in the data destined for the payload section, the iteration stops and the latest/current set of obfuscated data words and corresponding modified checksum is inserted into the data block, thus completing the data block and achieving the objective of creating a data block without erroneously present header patterns in the payload section.

In the iterative process the least significant bit of the checksum is the first bit to be modified and subsequently the bit in the next higher bit weight position is modified.

Example 7: Decoding Process

Figure 7:
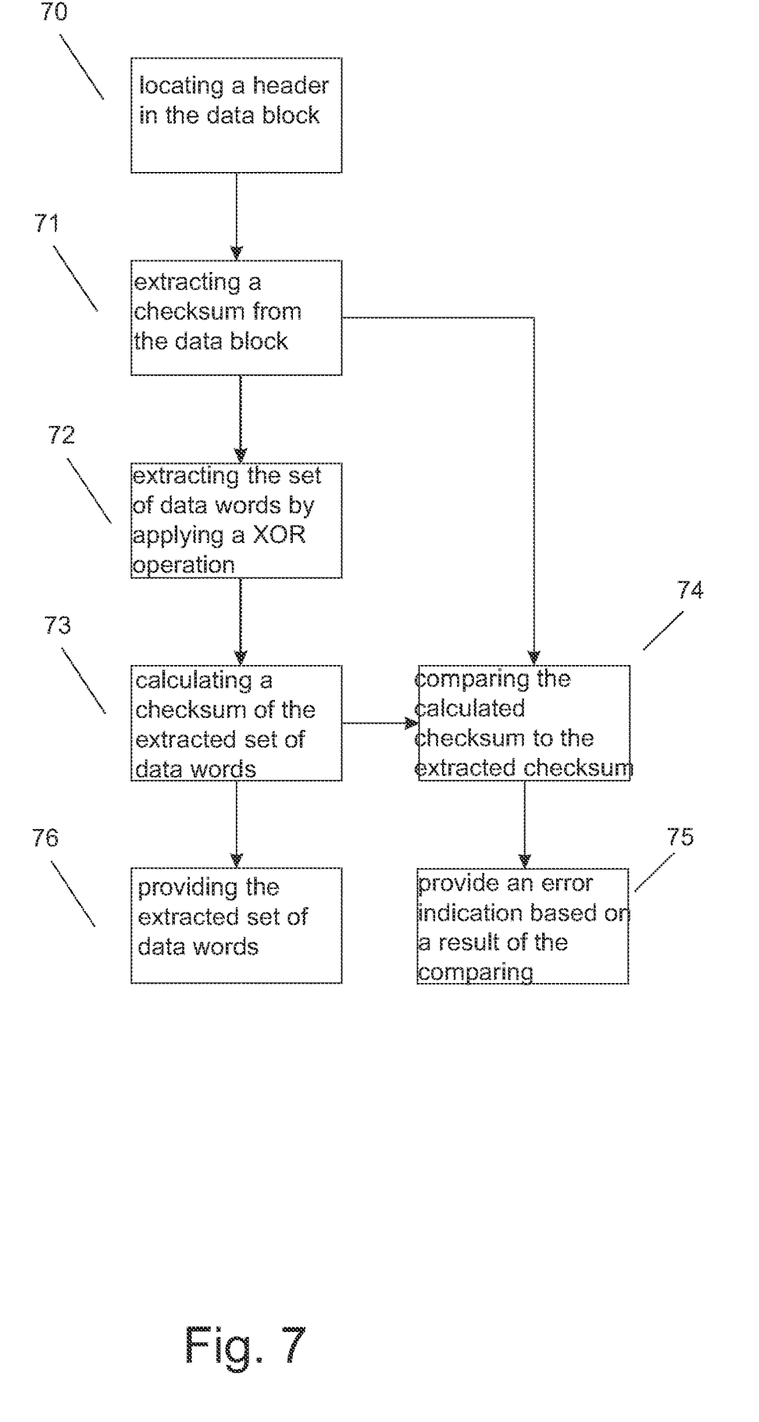
FIG. 7 illustrates an embodiment of the decoding process.

FIG. 7 illustrates an embodiment of the decoding process. The decoding method for converting a data block into a set of data words comprises the steps of locating 70 a header in the data block in order to enable the extraction of the other data in the data block as a start of the data block is needed for that extracting 71 a checksum from the data block, and extracting 72 the set of data words by applying an exclusive or operation between the code words of the data block and the extracted checksum.

calculating 73 a checksum of the extracted set of data words, and comparing 74 the calculated checksum to the extracted checksum and provide 75 an error indication based on a result of the comparing, providing 76 the extracted set of data words.

Both the extracted set of obfuscated data words and the extracted checksum are provided for data word extraction in the extraction step 72 which performs an exclusive or operation to the extracted checksum and extracted set of obfuscated data words. The result is the set of data words as originally presented to the encoder. The set of data words is subsequently provided 76 after code word extraction 72 to the output 16 of the decoder 10 after calculating 73 the calculated checksum over the extracted set of data words. The checksum calculation 73 thus calculates the checksum of the set of data words, not the set of obfuscated data words, and provides this calculated checksum for comparison 74. The comparison step 74 compares the calculated checksum to the extracted checksum received from checksum extraction step 71 and locates all bit positions that differ. A check is then performed to verify that the pattern of modification (i.e. positions of modified bits) comply with the pattern expected knowing the pattern of subsequent modification of the checksum bits by the encoder.

If the pattern matches (or there are no modified bits) the set of data words has been received without errors and an indication of this is provided 75.

If a difference is found that violates the pattern expected from the encoding an error in either the extracted checksum or extracted set of obfuscated data words is likely and an indication to this effect is provided 75.

The step of comparing the calculated checksum and the extracted checksum in effect locates a modified bit in the extracted checksum by comparing to the calculated checksum. The modified bits in the extracted checksum can advantageously be required to be adjacent.

The least significant bit of the extracted check sum is required to be modified if any bit of the extracted checksum is modified.

Example 8: Encoding Procedure in Pseudo-Code

This example considers one embodiment of the encoder, the encoding method and/or the recording device according to the present invention.

In this example, the header section is referred to as SOH (start-of-header marker), the set of data words is referred to as blob (binary large object), and the $n^{th}$ checksum used throughout iterations with increasing n is referred to as salt. Furthermore, the data block is assumed to comprise a length of the set of data words, indicating the size of the set of data words; this length is referred to as run length. Hence, the data block in this example, as illustrated e.g. by FIG. 5, consists of a SOH followed by a salt, in its turn followed by a payload section comprising the run length followed by the blob. Furthermore, ⊕ denotes the bitwise XOR operation.

In this example, the run length comprises a sequence of bytes and is encoded by means of run-length-encoding. Hereby, the most significant bit of each byte indicates if an extra byte will come. The final byte has a most significant bit equal to zero, whereas the other bytes have their most significant bit set to one. With such a type of run-length-encoding, the other 7 bits of each byte are used to encode the size itself, using the big endian order.

In this example, the checksum is calculated by means of the Fletcher-32 checksum algorithm, with a 32 bit checksum length. In view of the desire to keep the decoder as simple as possible, this type of checksum algorithm is an advantageous choice. Alternatively, a 32 bit cyclic redundancy check algorithm (CRC) may be applied.

Figure 8:
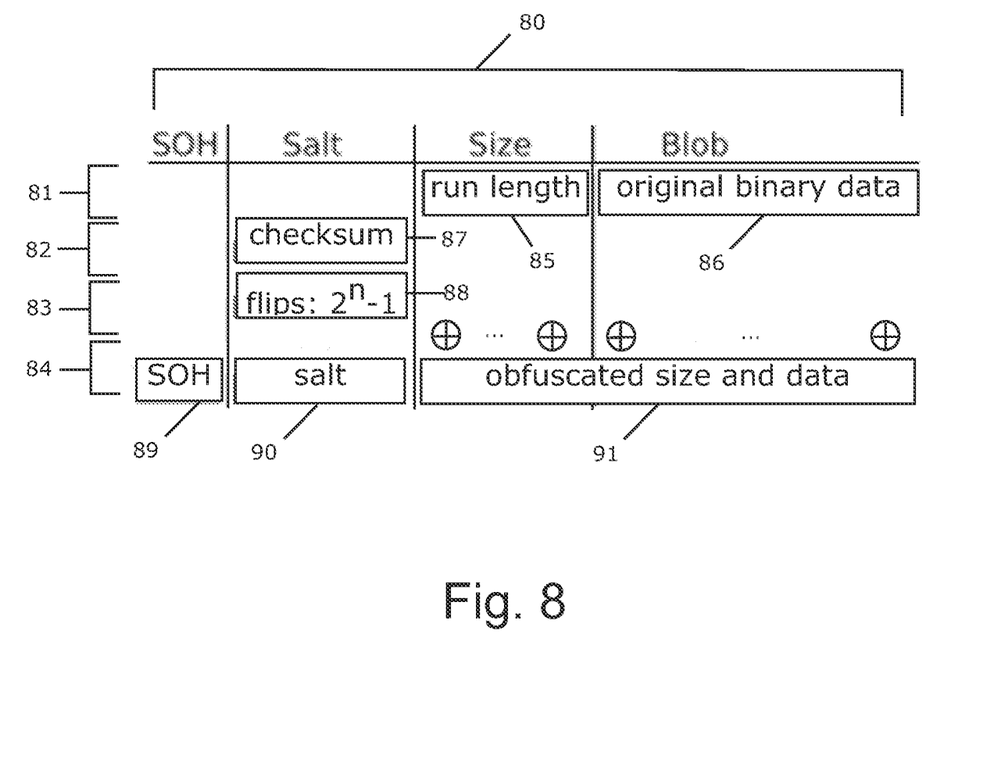
FIG. 8 illustrates an encoding procedure example.

FIG. 8 illustrates an encoding procedure example, with a schematic table comprising a column header 80 and rows 81-84. The column headers indicate the respective parts of the data block that is being encoded, consisting of the SOH, the salt, the size and the blob. With reference to FIG. 8, to encode the blob, the following steps can be followed:

(01) Encode the run length 85 (i.e., the blob size) using run-length encoding and place it before the blob 86. This is illustrated in the first row 81.

(02) Compute the checksum 87 of the concatenation of the run length 85 and the blob 86. This is illustrated in the second row 82.

(03) Set the iteration counter n=0.

(04) For each iteration, create the salt 90 via the operation salt=checksum⊕$2^n$−1 and place it before the concatenation of the run length 85 and blob 86. For each iteration, this boils down to "flipping" another bit of the checksum. This is illustrated in the third row 83.

(05) Obfuscate the concatenation of the run length 85 and the blob 86 by xor-ing it with the salt 90, to obtain the obfuscated run length and blob 91. This is illustrated in the fourth row 84.

(06) Check for the presence of the SOH sequence. The input for this check should at least be the salt, the run length and the blob. In a preferred embodiment, this check is performed for the concatenation of the SOH, the salt, the size and the blob, respectively. This way, the chance of finding a header sequence in the encoded data block at any other position than the first may be further mitigated. In another embodiment, this check may even be done more "strictly", by performing the check for the concatenation of the SOH, the salt, the size, the blob and another SOH. This way, the chance of finding a header sequence in a burst of "appended" encoded data blocks at any other position than at the start of the respective encoded data blocks may also be mitigated.

(07) If the SOH is found at any position other than the actual start of the intended data block and n≤32, increase n by 1 and go back to step (04).

(08) Generate an encoded data block as the respective concatenation of the SOH 89, the salt 90, and the obfuscated run length and blob 91.

Example 9: Decoding Procedure in Pseudo-Code

This example considers one embodiment of the decoder, the decoding method and/or the playback device according to the present invention. This example is intended to be counterpart to the encoding procedure discussed in Example 8, with corresponding wording. To detect and decode an encoded set of data words, or, equivalently, an encoded blob, the following two processes should run:

Detecting of SOH.

Decoding the data when a SOH is detected.

In a preferred embodiment, as soon as a SOH is detected—even if there decoding is still running—the decoding is (re)started. This has the advantage of further simplifying the decoding procedure.

Decoding consists of:
[01] collecting the salt bytes;
[02] de-obfuscating the other bytes using the salt;
[03] decoding the run length-coded size to know the blob size;
[04] optionally, performing a check to verify that the pattern of modification of the salt, i.e. the $n^{th}$ checksum, matches the pattern expected based on the decoded blob.

The invention claimed is:

1. An apparatus comprising: a hardware encoder that converts a set of data words into a data block having a header section, a checksum section and a payload section; the hardware encoder configured to:
  insert, by using a header inserter logic, a header pattern in the header section of the data block prior to transmission;
  calculate, by using a checksum calculator algorithm, a checksum of the set of data words;
  convert, by using a data word converter logic, the set of data words into a set of obfuscated data words being a first result of applying an exclusive OR operation between the set of data words and the checksum, said checksum comprising a number of bits;
wherein the hardware encoder is further configured to, based on a header pattern being detected in the first result or a second result of the exclusive OR operation, in a number of iterations n, n being a natural number between 1 and the number of bits in the checksum,
  create an nth checksum, n being the number of iterations, by modifying, by using a checksum modifier logic, an nth bit of the checksum, n being the number of iterations,
  convert, by using the data word converter logic, the set of data words into an nth set of obfuscated data words, n being the number of iterations, being the second result of applying an exclusive OR operation between the set of data words and the nth checksum,
  detect, by using a header pattern detector logic, a header pattern in the nth set of the obfuscated data words; when no header pattern is detected, control a payload inserter logic to insert the nth checksum in the checksum section and the nth set of the obfuscated data words in the payload section of the data block; and
  transmit the data block to a transmitter device.

2. The apparatus as claimed in claim 1, where an (n+1)th bit is adjacent to the nth bit of the checksum.

3. The apparatus as claimed in claim 2, where when n=1, the least significant bit of the checksum is the bit to be modified.

4. The apparatus as claimed in claim 1, further comprising a hardware decoder that converts the data block into the set of data words, the hardware decoder being configured to:
  locate, by using a header detector logic, a header in the data block;
  extract, by using a checksum extractor logic, a checksum from the data block;
  extract, by using a code word converter logic, the set of data words by applying an exclusive OR operation between code words of the data block and the extracted checksum;
  calculate, by using a checksum calculator algorithm, a checksum of the extracted set of data words; and
  compare, by using a checksum verifier logic, the calculated checksum to the extracted checksum and provide an error indication based on a result of the comparing.

5. The apparatus as claimed in claim 4, where the hardware decoder, by using the checksum verifier logic, locates modified bit in the extracted checksum by comparing the extracted checksum to the calculated checksum.

6. The apparatus as claimed in claim 5, where the hardware decoder locates a second modified bit in the extracted checksum by comparing the extracted checksum to the calculated checksum, where the modified bit and the second modified bit in the extracted checksum are required to be adjacent.

7. The apparatus as claimed in claim 6, where a least significant bit of the extracted checksum is required to be modified when any bit of the extracted checksum is modified.

8. The apparatus as claimed in claim 1, further comprising a recording device, the recording device comprising the hardware encoder.

9. The apparatus as claimed in claim 4, further comprising a playback device, the playback device comprising the hardware decoder.

10. A method comprising encoding steps for converting a set of data words into a data block, the encoding steps comprising:
  inserting a header pattern in a header section of the data block prior to transmission;
  calculating a checksum of the set of data words, the checksum comprising a number of bits;
  converting the set of data words into a set of obfuscated data words being a first result of applying an exclusive OR operation between the set of data words and the checksum;
wherein the method further comprises the steps of, for each of a number of iterations n, n being a natural number between 1 and the number of bits in the checksum, and based on a header pattern being detected in the first result or a second result of the exclusive OR operation:
  creating an nth checksum, n being the number of iterations, by modifying an nth bit of the checksum, n being the number of iterations;
  converting the set of data words into an nth set of obfuscated data words, n being the number of iterations, being the second result of applying an exclusive OR operation between the set of data words and the nth checksum;
  detecting a header pattern in the nth set of the obfuscated data words; when no header pattern is detected, inserting the nth checksum in a checksum section of the data block and the nth set of the obfuscated data words in a payload section of the data block; and
  transmitting the data block to a transmitter device.

11. The method as claimed in claim 10, where an (n+1)th bit is adjacent to the nth bit of the checksum.

12. The method as claimed in claim 11, the checksum having a least significant bit, and where the least significant bit of the checksum is the first bit to be modified.

13. The method as claimed in claim 10, further comprising decoding steps for converting the data block into the set of data words, the decoding steps comprising:
  locating a header in the data block;
  extracting a checksum from the data block;
  extracting the set of data words by applying an exclusive OR operation between code words of the data block and the extracted checksum;
  calculating a checksum of the extracted set of data words; and comparing the calculated checksum to the extracted checksum and provide an error indication based on a result of the comparing.

14. The method as claimed in claim 13, where the method comprises the step of locating a modified bit in the extracted checksum by comparing the extracted checksum to the calculated checksum.

15. The method as claimed in claim 14, comprising the step of locating a second modified bit in the extracted checksum by comparing the extracted checksum to the calculated checksum, where the modified bit and the second modified bit in the extracted checksum are required to be adjacent.

16. The method as claimed in claim 15, where a least significant bit of the extracted checksum is required to be modified when any bit of the extracted checksum is modified.

* * * * *